United States Patent [19]

Gentile et al.

[11] 4,299,649
[45] Nov. 10, 1981

[54] VAPOR TRANSPORT PROCESS FOR GROWING SELECTED COMPOUND SEMICONDUCTORS OF HIGH PURITY

[75] Inventors: Anthony L. Gentile, Thousand Oaks; John L. Bowers, Pacific Palisades; Oscar M. Stafsudd, Los Angeles, all of Calif.

[73] Assignee: Hughes Aircraft Company, Culver City, Calif.

[21] Appl. No.: 92,607

[22] Filed: Nov. 8, 1979

Related U.S. Application Data

[63] Continuation of Ser. No. 877,927, Feb. 15, 1978, abandoned, which is a continuation of Ser. No. 734,925, Oct. 22, 1976, abandoned.

[51] Int. Cl.[3] ............................................. C30B 25/02
[52] U.S. Cl. ........................... 156/610; 156/DIG. 77; 23/305 R
[58] Field of Search ............... 156/610, 614, DIG. 72, 156/DIG. 70, 611-613, DIG. 77, DIG. 92; 148/175; 23/305 R

[56] References Cited

U.S. PATENT DOCUMENTS 3,121,062  2/1964  Gould ................................. 156/610

FOREIGN PATENT DOCUMENTS 944052 12/1963 United Kingdom ................ 156/610

OTHER PUBLICATIONS

Boyd, J., of Applied Phys. V30 #2, Feb. '59, pp. 176-179.
Hillin J., of Crystal Growth, 13/14 5'72, pp. 624-634.

Primary Examiner—Hiram Bernstein
Attorney, Agent, or Firm—William J. Bethurum; William H. MacAllister

[57] ABSTRACT

The specification describes a process for growing selected compound semiconductors of high stoichiometry and purity and includes the steps of providing both a dynamic vacuum and a predetermined temperature profile in a container or tube containing a chosen semiconductor source material. The dynamic vacuum is used to create a predetermined minimum overpressure, $P_{min}$, in this container with respect to the vapor pressure of the source material, while simultaneously removing impurities through in opening in the container during the crystal growth process. This process involves the vapor transport of elements of the selected compound semiconductor from the source material to a suitable support member, such as a graphite crucible which is maintained at a predetermined uniform controlled temperature. Alternatively, the crystal growth process can be in the form of a vapor phase epitaxial process wherein the selected compound semiconductor is epitaxially deposited on a chosen semiconductor substrate whose temperature is also closely controlled.

6 Claims, 2 Drawing Figures

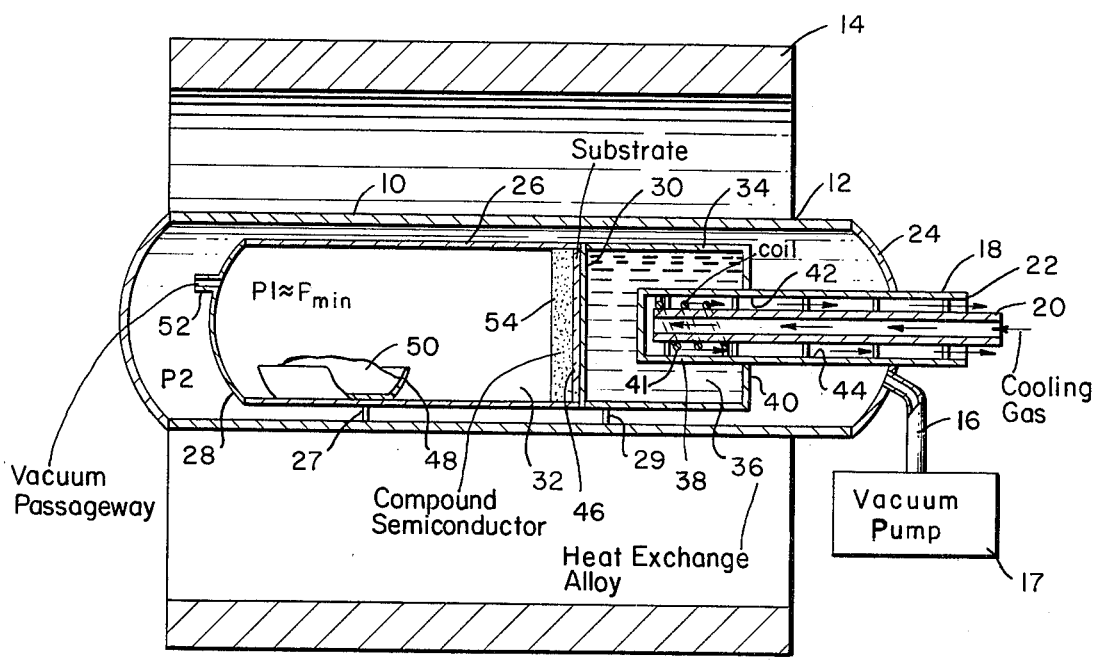

VAPOR TRANSPORT PROCESS FOR GROWING SELECTED COMPOUND SEMICONDUCTORS OF HIGH PURITY

This is a continuation of application Ser. No. 877,927 filed Feb. 15, 1978 now abandoned which in turn is a continuation application of Ser. No. 734,925 filed Oct. 22, 1976, now abandoned.

FIELD OF THE INVENTION

This invention relates generally to vapor transport crystal growth processes and more particularly to such a process for vapor depositing selected high-quality II-VI compound semiconductors useful as infrared window materials.

BACKGROUND

In the art of growing semiconductor materials and particularly infrared modulator and window materials, it is manifestly desirable to grow either in bulk polycrystalline form or by epitaxial deposition certain selected binary or ternary compound semiconductors with near-perfect stoichiometry and with a minimum of defects (and thus vacancies) in the crystal lattice of the grown material. As is well known, the stoichiometry, impurities and native defects in the grown crystal determine the electrical and optical properties of the material. And, in some instances, the optimum electrical and optical properties of the grown material correspond directly to an optimum in stoichiometry and a minimum in impurities and lattice defects in the grown crystal. For example, a minimum optical absorption coefficient for certain II-VI semiconductor compounds corresponds directly to an optimum in the stoichiometry and a minimum in impurities and lattice defects in the grown crystal. For a further discussion of the relationship of stoichiometry, impurities and native defects of certain II-VI compound semiconductors, e.g. CdTe, to their optical properties, reference may be made to an article by A. L. Gentile et al entitled "A Thermal Annealing Procedure For the Reduction of 10.6 μm Optical Losses in CdTe", *Material Research Bulletin, Vol.* 8, pp 523-532, 1973, Pergamon Press, Inc.

Many different types of bulk polycrystalline and epitaxial single crystal growth processes have been used in the past to grow selected II-VI compound semiconductors, and particularly the following compound semiconductors with which the present invention is primarily concerned:

Zinc Selenide (ZnSe)
Zinc Sulphide (ZnS)
Zinc Telluride (ZnTe)
Cadmium Sulphide (CdS)
Cadmium Selenide (CdSe)
Cadmium Telluride (CdTe)

Among these processes are included certain vapor transport processes which are carried out at approximately atmospheric pressure and using known inert carrier gases to combine selected reactants at a chosen location in the formation of the desired compound semiconductor. The location could, for example, be one surface of a graphite crucible where bulk polycrystalline compound semiconductors are formed, or it could be a selected monocrystalline substrate upon which the material is epitaxially deposited.

While the above vapor transport processes have generally proven satisfactory in the formation of compound semiconductive materials used for certain types of optical applications, they are inherently limited, purity wise, by the open-tube nature of the system and are therefore inadequate for producing suitable high purity compound semiconductors for other special types of optical applications.

One process which has been used to improve upon the stoichiometry and purity levels of crystals grown by the above described vapor transport process employs a sealed tube which is located in a furnace having a predetermined temperature profile. Such profile is closely controlled with respect to the source and grown materials which are located, respectively, at opposite ends of the sealed tube. In this process, the differential pressures produced by the controlled thermal gradient in the tube are responsible for the transport of elemental vapors of the source material to the other end of the tube where they recombine and are deposited either on a crucible or a selected substrate.

While this closed tube process improves upon the stoichiometry and purity levels of the grown crystals relative to those produced by the above open-tube system, it is nevertheless a relatively slow process and is still limited, purity-wise, as a result of the completely closed nature of the system. These two disadvantages have been either partially or completely eliminated by the present invention to be described below.

THE INVENTION

The general purpose of this invention is to provide a new and improved crystal growth process for forming II-VI compound semiconductors and which substantially improves upon the stoichiometry, purity and growth rate of crystals grown using the above closed-tube system.

To accomplish this purpose, we have discovered and developed a novel dynamic vacuum crystal growth process wherein, initially, a selected semiconductor source material is provided in a container (tube) located in a furnace operative with a controlled temperature profile. The container has an opening therein which is used in the creation of a dynamic vacuum within the container, and such vacuum is used to establish a predetermined minimum overpressure, $P_{min}$ at the source material relative to the elemental vapor pressures thereof. Additionally, this dynamic vacuum is utilized to remove impurities from within the container throughout the crystal growth process. Such process involves the vapor transport of elemental gases of a compound semiconductor from a solid semiconductor source material to a remote crystal growth support member within the controlled temperature profile. Thus, the dynamic vacuum not only enhances the growth rate of the vapor transport process as a result of producing the above defined $P_{min}$ (in the crystal growth container, but it also simultaneously removes impurities from this container during the crystal growth process. Furthermore, the compositions of the elemental vapors and the elements of the solid within the chamber are the same at $P_{min}$, so that the process has the effect of providing excellent control of the stoichiometry in the grown crystal.

Accordingly, it is an object of the present invention to provide a new and improved vapor transport crystal growth process for forming high purity II-VI compound semiconductors.

Another object is to provide a crystal growth process of the type described exhibiting a substantially increased crystal growth rate relative to analogous prior art processes, thereby decreasing the relative cost of the process.

A further object is to provide an improved crystal growth process of the type described featuring means by which impurities may be removed from a crystal growth container all during crystal growth, thereby enhancing the ultimate purity levels and stoichiometry of the grown crystal.

A further object is to provide a crystal growth process of the type described wherein any excess of one of the constituent elemental gases forming the grown compound semiconductor will, like extraneous impurities, also be removed from the crystal growth container during the process to thereby substantially enhance the stoichiometry of the grown mixed crystals.

These and other objects and features of the invention will become more readily apparent in the following description of the accompanying drawing.

DRAWING

FIG. 1 is a schematic diagram of one vapor transport dynamic vacuum system useful in practicing the invention.

FIG. 2 is a temperature profile for the vapor transport system of FIG. 1.

Referring now to FIG. 1, there is shown an outer fused silica tube 10 which is mounted in a cylindrical passage 12 in a crystal growth furnace 14. This outer tube 10 has a vacuum line 16 extending as shown from one wall thereof to a vacuum pump 17. The silica tube 10 further includes an opening 18 in the right-hand end thereof for receiving a pair of coaxial tubular sections 20 and 22 which are used for temperature control purposes to be further described. Advantageously, the entire rounded right-hand end 24 of the outer quartz tube 10 may be removed from the remainder of the tube 10 in order to permit the insertion therein of an inner graphite tube or container 26 in the position shown in FIG. 1. This wall 24 may, for example, be removably bonded to the remainder of the tube 10 using commercially available silicia-to-silica bonds (cements).

The inner graphite tube 26 is supported inside the outer tube 10 by conventional mechanical supports 27 and 29, whose details have been omitted in the drawing for sake of clarity. The inner graphite container 26 also includes a removable rounded graphite end wall 28 which may be bonded to the cylindrical container 26 by conventional and commercially available graphite-to-graphite cements. The inner container 26 is removably joined to an inside vertical wall 30 which serves as a separation member between a crystal growth chamber portion 32 of the container 26 and a crystal growth temperature control chamber portion 34. This latter portion 34 is adapted to receive a liquid heat exchange alloy 36 whose temperature is controlled to thereby precisely control the substrate temperature where the crystal growth ultimately takes place, as will be described. The vertical wall 30 will be removed from within the container 26 while the chamber portion 34 is being filled with the heat exchange alloy 36. In one crystal growth process which we have carried out in the actual reduction to practice of our invention, the heat exchange alloy 36 consisted of 49.5 weight percent bismuth, 17.6 weight percent lead, 11.6 weight percent tin and 21.3 weight percent indium.

The heat exchange alloy 36 surrounds a hollow cylindrical section 38 which may be made integral with the end wall 40 of the chamber 26. This cylindrical section 38 includes a plurality of heater coils 41 which are attached and suspended as shown between the top and bottom walls 42 and 44 of the cylindrical section 38. These coils 41 are electrically energized with RF currents sufficient to provide controlled RF induction heating of heat exchange alloy 36.

A selected cooling gas is introduced, as indicated, into the inner tubular section 20 of the apparatus in order to provide an added measure of temperature control to the system, particularly with respect to the rate at which the heat exchange alloy is cooled. These temperature control gases flow into the open right-hand end of the hollow section 20 and around its open left-hand end and then back out of the section 38 between the inner and outer tubular sections 20 and 22.

After the compartment 34 is filled with the heat exchange alloy 36 and the vertical enclosing wall 30 has been positioned in place as shown in FIG. 1, the left-hand end 28 of the graphite tube 10 is removed so that a chosen substrate 46 may be mounted vertically as shown in abutment with the vertical wall 30 previously described. This substrate 46 may be graphite in the polycrystalline or bulk crystal growth process according to the invention, or it may be a monocrystalline semiconductor material in the case of the epitaxial deposition process embodying the invention. In either case, the substrate 46 may advantageously be removably bonded to the vertical wall 30 using commercially available graphite-to-graphite or semiconductor-to-graphite cements which are capable of withstanding temperatures on the order of 1000° C. or greater.

After the substrate 46 is mounted in place as shown in FIG. 1, a graphite or quartz crucible 48 is positioned in place in the crystal growth chamber 32 at the left-side location shown and remote from the substrate 46. The crucible 48 contains the II–VI compound semiconductor source material 50 of any one of the above-identified compounds, and this compound decomposes into its elemental semiconductor vapors as the present process proceeds and after, of course, the end wall 28 of the inner container 26 has been repositioned in place as shown in FIG. 1. As will be further explained, the end wall 28 has a small open passageway 52 integral therewith which permits a dynamic vacuum to be pulled inside the chamber 32 and controlled, of course, by a suitable vacuum pump 17.

The furnace member 14 is programmed so as to provide the particular temperature profile shown in FIG. 2 when crystal growth is scheduled to begin. Here the source material 50 is at approximately a first pre-determined temperature T1, and the carbon-coated substrate 46 is at a second lower pre-determined temperature T2. These temperatures T1 and T2 are typically 1005° C. and 1000° C., respectively, and have been empirically determined by the optimum vapor transport rate within the chamber 32 and the minimum acceptable grain size for crystal deposition. Such grain size must, of course, be sufficiently large to insure that the semiconductor material is deposited in a crystal form rather than in a powder, thus minimizing material losses in the process. As indicated aove, the source material 50 may be any one of the following II–VI semiconductor materials: zinc sulphide (ZnS), zinc selenide (ZnSe), zinc telluride (ZnTe), cadmium sulphide (CdS), cadmium selenide (CdSe), or cadmium telluride (CdTe).

When zinc selenide is used, for example, as the source material 50, the following equation defines the thermal decomposition of zinc selenide in the solid form to elemental zinc and selenium in the gaseous form.

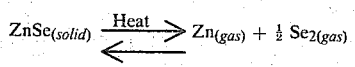

Similar equations exist in the literature for the other II–VI compound semiconductors listed above. Thus, the solid zinc selenide decomposes into its elemental vapors which are transported in accordance with the controlled differential pressures and temperatures inside the compartment 32 and then recombine as the infrared window material 54 as will be further described.

In accordance with the present invention, it has been discovered that an extremely rapid transport of the elemental gases from the source material 50 to the substrate 46 will occur, and further, that a very pure form of crystal growth at the substrate 46 can be achieved if a minimum overpressure, $P_{min}$, is maintained inside the compartment 32. $P_{min}$ is defined as that minimum pressure within the compartment 32 just sufficient to maintain a solid-gas equilibrium as defined in the above solid decomposition equation for a given temperature at the source material 50. Such minimum overpressure $P_{min}$ is achieved by providing a controlled dynamic vacuum within the compartment 32 and such vacuum is continuously pulled through the pump line 16 and produced by a vacuum pump 17 connected thereto. This dynamic vacuum not only provides the above required $P_{min}$ for the optimum and rapid vapor transport and crystal growth within the compartment 32, but it simultaneously removes any existent excesses of one of the elemental vapors produced by the decomposition of the solid 50. In this manner, the elemental gases such as zinc and selenium arrive in exact stoichiometric proportions when they reach the substrate 46 to thereby deposit in a highly pure bulk polycrystalline form or deposit epitaxially in a highly pure monocrystalline form. Furthermore, the utilization of a dynamic vacuum on the crystal growth chamber 32 removes any other extraneous impurities which might exist within the chemical vapor deposition system described. Thus, any impurities with a higher vapor pressure than the vapor pressure of the source material 50 will be pumped out through the outlet passsge 52 when a dynamic vacuum establishing $P_{min}$ is placed on the vacuum pump line 16. Materials with vapor pressures lower than the vapor pressure of the source material 50, such as carbon or silicon, will not be transported to the substrate 46.

All of the above II–VI semiconductor compounds have similar chemical bonding and vapor pressures, the latter of which are relatively high. Furthermore, the above chemical equation describing the thermal decomposition of ZnSe is generally similar to those decomposition equations for each of the above named II–VI semiconductor compounds, and these equations are unique in that the gases of the equation exist in elemental form. When the above-described crystal growth system is under a dynamic vacuum condition to maintain an overpressure, $P_{min}$, equivalent to the minimum total pressure in the chamber 32 necessary to allow the gas phase of the particular II–VI semiconductor compound to be equivalent in composition to that of the solid source material 50, the conditions for rapid vapor transport and pure crystal deposition are optimized. Of course, the above-described temperature differential between source 50 and substrate 46 must be utilized for the optimum vapor transport rates, as outlined in more detail in the following example of one process which has been actually reduced to practice:

EXAMPLE

Approximately 3000 grams of ZnSe were placed in the crucible 48 and, with the tubes 10 and 26 arranged in the closed position shown in FIG. 1, the vacuum line 16 was connected to the vacuum pump 17. This pmp 17 was used to provide a vacuum pressure of $10^{-7}$ Torr for the pressure P2 outside the vacuum bleed passage 52. This had the effect of creating a pressure of approximately 0.7 Torr for the pressure P1 inside the chamber 10, which was just slightly greater than $P_{min}$, previously defined.

The pressure P1 was derived as a calculated maximum value based upon the control of pressure through the small aperture of the passage 52. For our calculations, we considered the pressure P1 of a large region such as that inside the inner growth container 26 as being constant. Then, in order to create the preferred pressures for P1 and P2, P1 was initially controlled by heating the source material 50 at a constant temperature, and P2 was controlled by controlling the pressure of the vacuum pump 17. As the pressure P2 was lowered, the amount of gas flowing from the chamber 32 and through the passage 52 was increased, and the terminal velocity of the gas flowing out of the passage 52 was also increased until the ratio of P2/P1 reached a critical minimum. A further reduction in P2 produced no further increase in either the gas outflow or the jet velocity through the passage 52. The above specific values in Torr of pressure for P1 and P2 apply to this condition, where P2/P1 is at a critical minimum and the source material is at a constant temperature.

With the pressure P1 and P2 thus established, the temperature of the graphite substrate 46 was initially raised to a value greater than the temperature of the source material 50 in order to prevent any vapor transport from occurring in the tube 26. Then, the substrate 46 temperature was lowered until it was less than the source temperature T1 by about 5° C., whereupon vapor transport inside the container 26 began. The corresponding values of T1 (1005° C.) and T2 (1000° C.) are given above, and the corresponding profile for these temperatures is shown in FIG. 2. Essentially all crystal growth was achieved using this 5 degree temperature differential. However, in the present example, we further lowered T2 to about 950° C. and at a rate of about 2° C. per hour to complete the process and minimize materials waste and the like.

The grown bulk crystal 54 was then removed from the crystal growth container 26 and its IR transmissivity was measured using a Beckman Instruments IR Spectrophotometer. For a ZnSe crystal 54 about one-quarter inch in thickness and for radiation wavelengths between about 2½ and 50 micrometers, we measured an infrared transmission throughout the grown crystal of about 69%, which compared quite closely with a theoretical maximum of 71%. Therefore, the present process clearly demonstrated the fact that the speed and relatively low cost with which the present process was carried to completion did not diminish the achievable quality and purity of the grown crystals. This transmission percentage (69%) could quite conceivably be improved with an improvement in the purity of the starting source materials.

Although the present process has been described with particular reference to binary II–VI semiconductor compounds, it may also be used in the growth of certain high purity ternary compounds such as zinc sulphide selenide, $Zn\ S_{1-x}\ Se_x$, where $0 > X > 1$. This particular ternary compound combines the optimum mechanical strength characteristics of ZnS with the optimum optical characteristics of ZnSe. For example, the compound $ZnS_{0.85}Se_{0.15}$ has been determined to be especially useful as a good strong high quality IR window material which can be grown using the present inventive process. Additionally, the ternary compound zinc cadmium telluride, $Zn\ Cd_{1-x}\ Te_x$, is also quite useful as an infrared window material. Therefore, it should be understood that the present process is not limited, material-wise, to the growth of the particular II–VI compound semiconductors disclosed above.

What is claimed is:

1. A process for rapidly growing a selected II–VI compound semiconductor material of high purity including the steps of:
   (a) Providing a selected II–VI semiconductor source material at a first location within a crystal growth chamber;
   (b) providing a crystal growth support member at a second location within said chamber;
   (c) establishing a predetermined temperature profile within said chamber and between said first and second locations so that said support member is lower in temperature than said source material by a predetermined amount; and
   (d) creating a dynamic vacuum within said chamber suitable for causing dissociation of elemental gases from said source material and for establishing a predetermined minimum overpressure, $P_{min}$, at said source material which is substantially equivalent to the minimum tool pressure in said chamber required to allow the elemental composition of gases leaving said source material and flowing toward said support member to be substantially equal to the chemical composition of the elements of the semiconductor solid comprising said source material, whereby impurities within said chamber having a higher vapor pressure than $P_{min}$ will be removed therefrom under said dynamic vacuum while said gases are recombined in the solid form at said crystal growth support member.

2. The process defined in claim 1 wherein said source material is selected from the group of compound semiconductors consisting of zinc sulphide, zinc selenide, zinc telluride, cadmium sulphide, cadmium selenide, and cadmium telluride.

3. The process defined in claim 2 wherein said crystal growth may occur at said support member in either the bulk form or in the form of epitaxial growth on a selected substrate.

4. A process for growing semiconductor crystals which comprises:
   (a) providing both a II–VI compound semiconductor source material capable of producing elemental gases and a crystal growth support member in a predetermined dynamic vauum which establishes a predetermined minimum overpressure at said source material which is substantially equivalent to the minimum total pressure at said source material required to allow the elemental composition of gases leaving said source material to be substantially equal to the chemical composition of the elements of the semiconductor solid comprising said source material, and
   (b) creating a chosen temperature differential between said source material and said support member so that said support member is at a lower temperature than said source material by an amount sufficient to cause elemental gases of said II–VI compound semiconductor to dissociate from said source material and be transported from said source material to said support member and deposit out upon said support member, whereby said dynamic vacuum continuously removes volatile impurities and excess elemental gases from gases within said chamber and improves the purity and stoichiometry of the grown crystals.

5. The process defined in claim 4 wherein said source material is selected from the group of compound semiconductors consisting of zinc sulphide, zinc selenide, zinc telluride, cadmium selenide, cadmium sulphide, cadmium telluride, zinc sulphide selenide, and zinc cadmium telluride.

6. The process defined in claim 5 wherein said crystal growth may occur at said support member in either the bulk form or in the form of epitaxial growth on a selected substrate.

* * * * *